(12) United States Patent
Yu

(10) Patent No.: US 6,255,170 B1
(45) Date of Patent: Jul. 3, 2001

(54) FLASH MEMORY AND METHOD FOR FABRICATING THE SAME

(75) Inventor: Jae Min Yu, Chungcheongbuk-do (KR)

(73) Assignee: Hyundai Electronics Industries, Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/552,506

(22) Filed: Apr. 19, 2000

Related U.S. Application Data

(62) Division of application No. 09/145,132, filed on Sep. 1, 1998, now Pat. No. 6,069,383.

(30) Foreign Application Priority Data

Dec. 31, 1997 (KR) .............................................. 80700/1997

(51) Int. Cl.⁷ .............................................. H01L 21/8247
(52) U.S. Cl. .......................................... 438/264; 438/593
(58) Field of Search .................................... 438/257–267, 438/593–594, 279

(56) References Cited

U.S. PATENT DOCUMENTS

| | | |
|---|---|---|
| 3,956,865 | 5/1976 | Schmermund . |
| 4,084,393 | 4/1978 | Focke . |
| 4,154,438 | 5/1979 | Seragnoli . |
| 4,188,024 | 2/1980 | Seragnoli . |
| 4,392,338 | 7/1983 | Fox . |
| 4,487,596 | 12/1984 | Livens et al. . |
| 4,839,705 | 6/1989 | Tigelaar et al. . |
| 4,852,734 | 8/1989 | Allen et al. . |
| 5,045,489 | 9/1991 | Gill et al. . |
| 5,143,282 | 9/1992 | Pham . |
| 5,372,963 | 12/1994 | Mori . |
| 5,552,331 | 9/1996 | Hsu et al. ............................... 437/40 |
| 5,557,123 | 9/1996 | Ohta ..................................... 257/315 |
| 5,607,382 | 3/1997 | Boriani et al. . |
| 5,702,964 | * 12/1997 | Lee . |
| 5,723,350 | 3/1998 | Fontana et al. . |
| 5,741,719 | * 4/1998 | Kim . |
| 5,966,601 | * 10/1999 | Ling et al. ............................ 438/257 |
| 6,008,516 | 12/1999 | Mehrad et al. ....................... 257/315 |

FOREIGN PATENT DOCUMENTS

| | | |
|---|---|---|
| 28463386C2 | 3/1974 | (DE) . |
| 2718953 | 11/1977 | (DE) . |
| 3218639 | 11/1983 | (DE) . |
| 8715474 U1 | 3/1988 | (DE) . |
| 1467429 | 3/1977 | (GB) . |
| 2091162A | 7/1982 | (GB) . |
| 2123796A | 2/1984 | (GB) . |

* cited by examiner

*Primary Examiner*—Richard Booth
(74) *Attorney, Agent, or Firm*—Fleshner & Kim, LLP

(57) ABSTRACT

A memory device and a method for manufacturing the same is provided that reduces a resistance of the source region and reduces an effective cell size. The memory includes tunnel insulating films and floating gates formed stacked on a plurality of prescribed regions of a semiconductor substrate, a plurality of stacked gate insulating films, control gate lines and gate cap insulating films extend in a first direction with a zigzag pattern to cover the floating gates. Thus, the distance between adjacent control gate lines varies. Source regions are formed in the semiconductor substrate where a narrow space exists between the control gate lines stacked on the floating gates, and drain regions are formed in the semiconductor substrate where a wider space exists between the control gate lines stacked on the floating gates. Source contact regions are formed to expose the source regions, and a first conductive plate is coupled to the source regions. Bit line contact regions are formed to expose the drain regions. A second conductive line is formed in a direction crossing the control gate lines at a right angle coupled to the drain regions. The contact regions are formed in a zigzag pattern.

13 Claims, 5 Drawing Sheets

FLASH MEMORY AND METHOD FOR FABRICATING THE SAME

This application is a Divisional of Application No. 09/145,132 filed Sep. 1, 1998 now U.S. Pat. No. 6,069,383.

BACKGROUND OF THE INVENTION

1. Field of the Invention

The present invention relates to a semiconductor device, and more particularly, to a flash memory device and a method for fabricating the same that reduces source line resistivity and a device chip size.

2. Background of the Related Art

FIG. 1A illustrates a plan view of a background art flash memory, and FIG. 1B illustrates a cross section along line I—I in the device of FIG. 1A. Referring to FIGS. 1A and 1B, the background art flash memory is provided with a plurality of tunnel oxide films 2 and floating gates 3 stacked over a semiconductor substrate 1. Gate oxide films 4, control lines 5 and gate cap insulating films 6 are formed extending along one direction to cover the floating gates 3. Source regions 7a are formed in the semiconductor substrate 1 along one side of the control gate lines 5 stacked over the floating gates 3. The source regions 7a are connected outside the flash memory device through one self-aligned source contact region 7.

Sidewall spacers 8 are formed on both sides of the tunnel oxide film 2, the floating gate 3, the gate oxide film 4, the control gate line 5 and the gate cap insulating film 6. However, the sidewall spacers 8 between the floating gates 3 above the source contact region 7 are further etched down to sides of the gate oxide films 4. Drain regions 9a are formed in the semiconductor substrate 1 on the other side of the control gate lines 5 stacked over the floating gates 3, and bit line contact regions 9 are formed to expose the drain regions 9a. Bit line wirings 10 in contact with the bit line contact regions 9 are disposed in a direction perpendicular to the control gate lines 5.

As described above, the background art flash memory has various problems. The source resistance difference of flash memory cells coming from different positions in the array causes non-uniformity in programming and read. In the case of the background art flash memory cell having an SAS process applied thereto, the source resistance difference varies between 100 ohms to 2000 ohms depending on the cell position in an array, which causes non-uniformity of a programming voltage and cell current in programming and reading. The unequal programing voltages and cell currents within the cell array that reduce efficiency of the programming and reading operations. Further, the exposure of the gate oxide film, an inter poly dielectric, to an etching ambient when spacers are formed at sides of the source contact region by an anisotropic etching can damage the gate oxide film. In addition, as a cell size is reduced, it is difficult to secure spaces between adjacent bit lines formed in the bit line contact portions on the drain regions. That is, layout tolerances for active regions and bit lines are decreased because the bit line contacts are disposed on a straight line.

The above references are incorporated by reference herein where appropriate for appropriate teachings of additional or alternative details, features and/or technical background.

SUMMARY OF THE INVENTION

An object of the present invention is directed to a semiconductor device and a method for fabricating the semiconductor device that substantially obviates one or more of the problems caused by limitations and disadvantages of the related art.

Another object of the present invention is to provide a semiconductor device and a method for fabricating the same that reduces a source region resistance.

Another object of the present invention is to provide a flash memory and a method for fabricating the same that prevents a reduced bit line lay-out tolerance.

Another object of the present invention is to provide a flash memory and a method for fabricating a flash memory that dispenses with active lines and metal lines for source lines.

Another object of the present invention is to provide a flash memory and a method for fabricating a flash memory that reduces an effective cell size.

To achieve these and other objects and advantages in a whole or in parts and in accordance with the purpose of the present invention as embodied and broadly described, a semiconductor device includes a matrix of first gates on a semiconductor substrate, a plurality of second gates extending along a first direction to cover the first gates, source and drain regions formed adjacent the first gates on opposing sides of the second gates, a conductive layer contacting the source regions at source contact regions and second lines extending in a second direction substantially perpendicular to the first direction, wherein the second lines contact the drain regions at bit line contact regions, wherein the bit line contact regions in adjacent second lines are offset in the second direction.

To further achieve the above objects in a whole or in parts, there is provided a flash memory device according to the present invention that includes floating gates stacked on tunnel insulating films on a plurality of prescribed regions of a semiconductor substrate, a plurality of control gate lines extending in a first direction with a zigzag pattern to cover the floating gates, wherein a distance between adjacent control gate lines varies between first and second prescribed distances, source regions in the semiconductor substrate between adjacent floating gates that are separated by the second prescribed distance, drain regions in the semiconductor substrate between said adjacent floating gates that are separated by the first prescribed distance, source contact regions that expose the source regions, drain contact regions that expose the drain regions, a first line over the control gate lines and the semiconductor substrate excluding the drain regions, wherein the first line is coupled to the source regions through the source contact regions and a plurality of second lines extending in a second direction perpendicular to the first direction, wherein the second lines are coupled to the drain regions through the drain contact regions.

To further achieve the above objects in a whole or in parts, there is provided a method for fabricating a flash memory according to the present invention that includes forming floating gates stacked on tunnel insulating films on a plurality of prescribed regions of a semiconductor substrate, forming a plurality of control gate lines extending in a first direction to cover the floating gates, wherein a distance between adjacent control gate lines varies between first and second prescribed distances, forming sidewall spacers on both sides of the floating gates and the control gate line, respectively forming source regions and drain regions in the semiconductor substrate on opposite sides of the floating gates and the control gate lines between the sidewall spacers, depositing a first interlayer insulating film on the semiconductor substrate, forming source contact regions that expose the source regions through the first interlayer insulating film, depositing a conductive layer on the first interlayer insulating film coupled to the source contact regions, removing portions of the conductive layer on the drain regions to form a common source, depositing a second interlayer insulating film on the semiconductor substrate, forming drain contact regions that expose the drain regions through the second interlayer insulating film and forming bit lines extending in a direction perpendicular to the first direction coupled to the drain contact regions, wherein bit line contact regions in adjacent bit lines are offset in the second direction.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
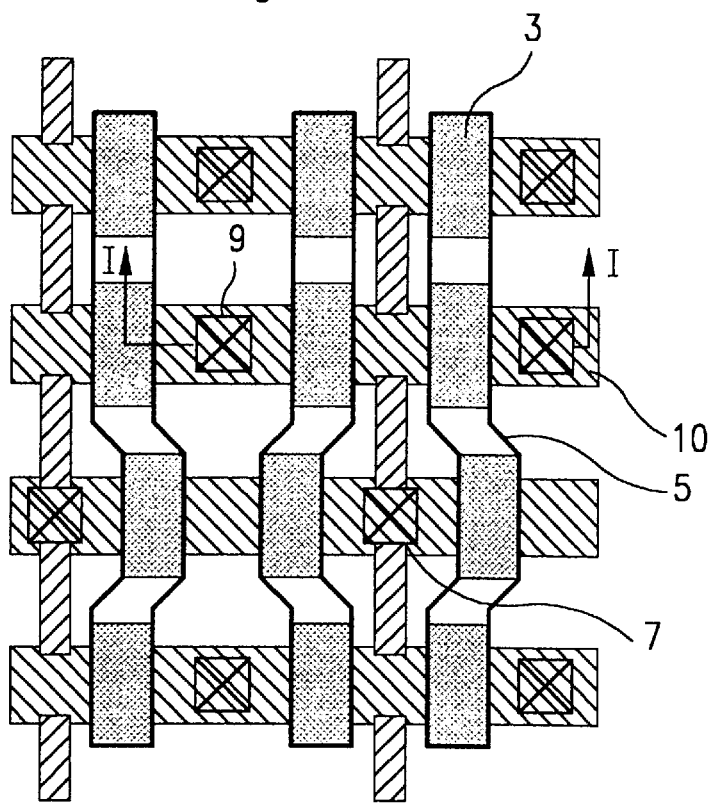
FIG. 1A is a diagram that illustrates a plan view of a background art flash memory.
Figure 1B:
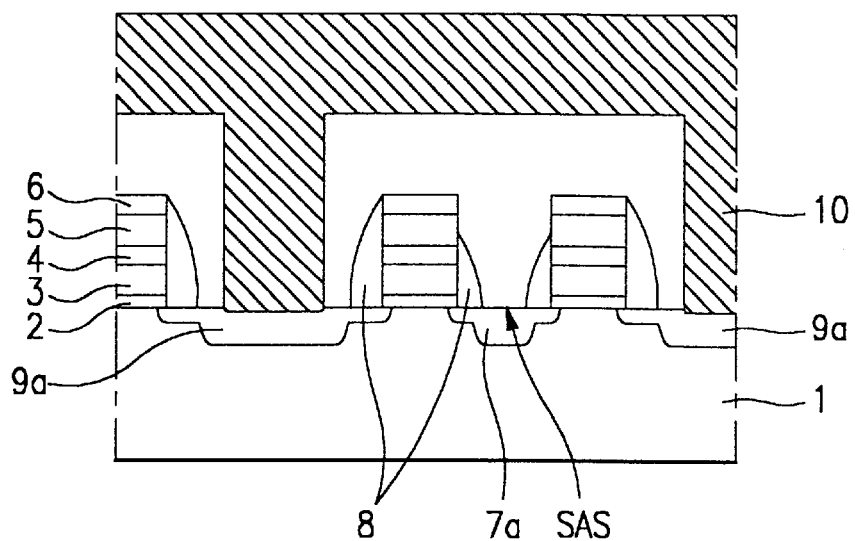
FIG. 1B is a diagram that illustrates a cross-section alone line I—I of FIG. 1A.
Figure 2A:
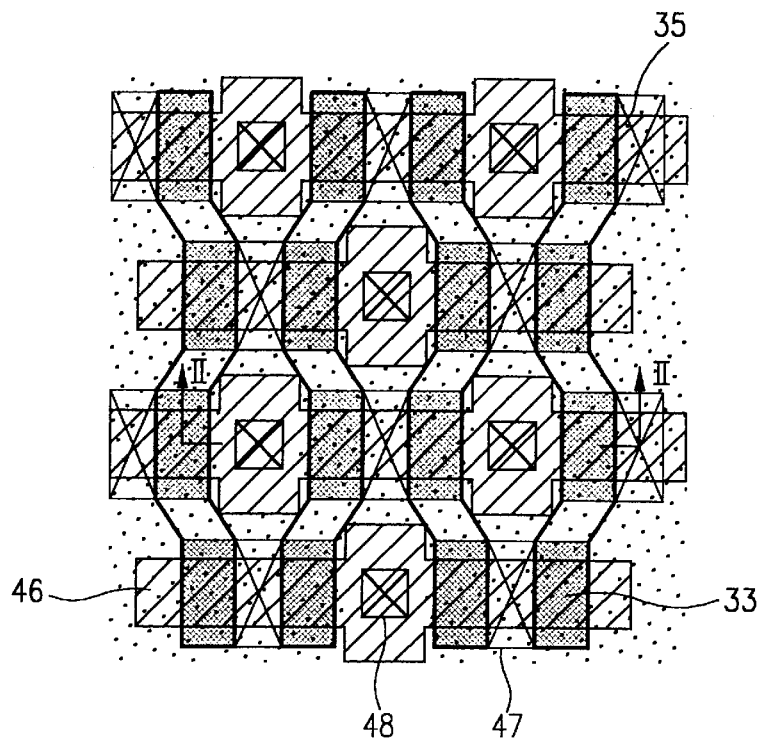
FIG. 2A is a diagram that illustrates a plan view of a flash memory in accordance with a preferred embodiment of the present invention.
Figure 2B:
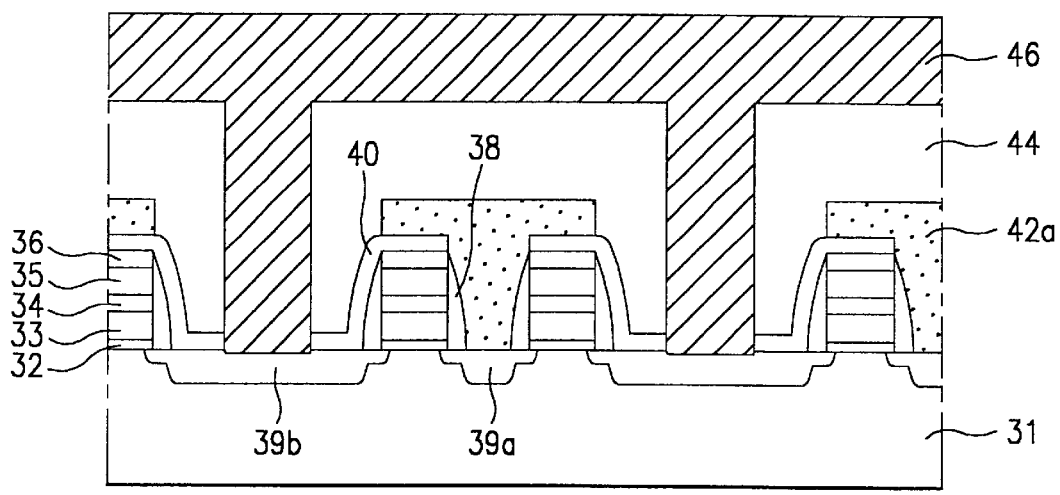
FIG. 2B is a diagram that illustrates a cross-sectional view along line II—II of FIG. 2A; and, FIGS. 3A–3G are diagrams that illustrate a method for fabricating a flash memory in accordance with a preferred embodiment of the present invention.

FIG. 2A is a diagram that illustrates a plan view of a flash memory in accordance with a preferred embodiment of the present invention. Referring to FIGS. 2A and 2B, the preferred embodiment of a flash memory device includes tunnel oxide films 32 and floating gates 33 stacked on a semiconductor substrate 31. Gate oxide films 34, control gate lines 35 and gate cap insulating films 36 are formed stacked on one another extending in one direction with a zig-zag pattern to cover the floating gates 33. The floating gate 33 and the zigzag control gate lines 35 overlap at every rectangular portion of the control gate line 35.

A space between adjacent control gate lines 35 varies with the zigzag pattern. Source regions 39a are formed in portions of the semiconductor substrate 1 where a narrower space occurs between the adjacent control gate lines 35 over the floating gates 33. Drain regions 39b are formed in portions of the semiconductor substrate 1 where a wider space occurs between the adjacent control gate lines 35 over the floating gates 33. Bit line contact regions 48 are formed to expose the drain regions 39b. The bit line contact regions 48 also have a zigzag pattern. Sidewall spacers 38 are formed at both sides of the tunnel oxide film 32, the floating gate 33, the gate oxide film 34, the control gate line 35 and the gate cap insulating film 36. A source contact region 47 is formed for each source region 39a in an array, and a first interlayer insulating film 40 is formed on portions of the device excluding the source contact regions 47. A flat source line 42a is formed in contact with the source contact regions 47 on an entire array surface excluding the drain regions 39b. Bit line 46 is formed in contact with the bit line contact region 48 in a direction perpendicularly crossing the control gate line 35.

A preferred embodiment of a method for fabricating a flash memory according to the present invention will now be described. FIGS. 3A–3G are diagram that illustrate cross-sectional views of a method for fabricating a flash memory in accordance with the preferred embodiment of the present invention. The preferred embodiment of the method for fabricating the flash memory can be used, for example, to fabricate the flash memory of FIGS. 2A–2B.

Figure 3A:
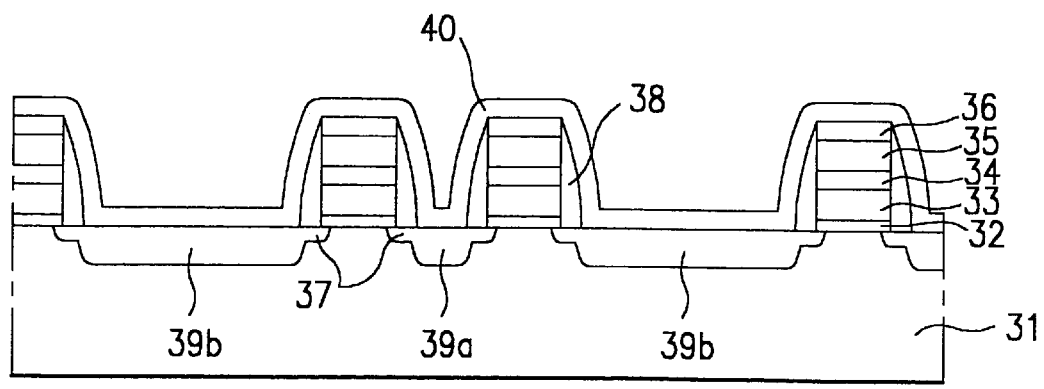

Referring to FIG. 3a, p wells are formed in required regions of an n type semiconductor substrate 31 having active regions (not shown) and field regions (not shown) defined therein. A thin first oxide film and a first silicon layer are deposited in succession on the semiconductor substrate 31 and subjected to anisotropic etching preferably using a floating gate formation mask to form a first oxide film line and a first silicon line. A second oxide film, a second silicon layer and a cap insulating film are deposited on an entire surface. The cap insulating film, the second silicon layer, the second oxide film, the first silicon line and the first oxide film line are subjected to anisotropic etching in succession using a zigzag formed control gate formation mask to form tunnel oxide films 32, floating gates 33, gate oxide films 34, control gates 35 and gate cap insulating films 36 as shown in FIG. 2A. The floating gates 33 are overlapped with the control gate lines 35 at every rectangular portion of the control gate lines 35.

N type impurity ions are injected into a surface of the semiconductor substrate 31 on both sides of the stacked floating gates 33 and the control gate lines 35 in the active region to form Lightly Doped Drain (LDD) regions 37 therein. Then, a third oxide or nitride film is deposited on an entire surface of the semiconductor substrate 31 and etched back to form sidewall spacers 38. N type ions are heavily injected into the semiconductor substrate 31 on both sides of the floating gates 33, the control gates 35 and the sidewall spacers 38 in the active region to form source regions 39a and drain regions 39b. The source regions 39a are formed in the semiconductor substrate 31 between the floating gates 33 under portions of the control gate lines 35 that are closely spaced. The drain regions 39b are formed in the semiconductor substrate 31 between the floating gates 33 under portions of the control gate lines 35 that are widely spaced. A first interlayer insulating film 40 of a fourth oxide or nitride film is formed on an entire surface of the semiconductor substrate 31.

Figure 3B:
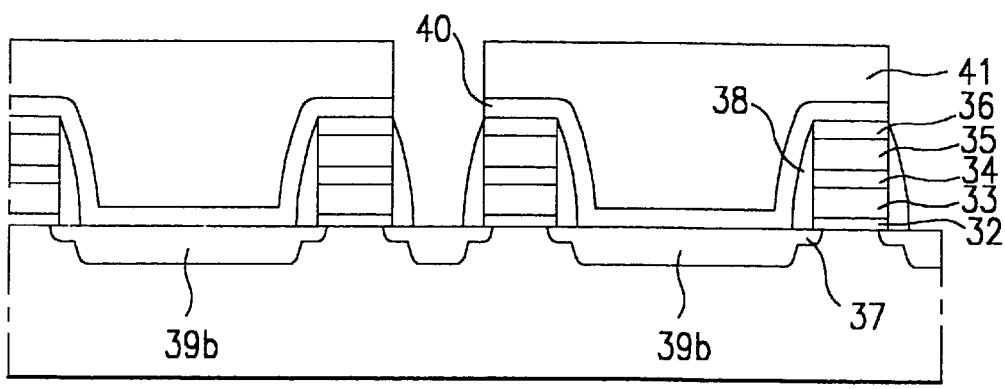

As shown in FIG. 3b, a first photoresist film 41 is coated and subjected to patterning by exposure and development to expose regions between the floating gates 33 under portions of the control gate lines 35 that are closely spaced. The first interlayer insulating film 40 is subjected to anisotropic etching using the patterned first photoresist film 41 as a mask to expose the source regions 39a.

Figure 3C:
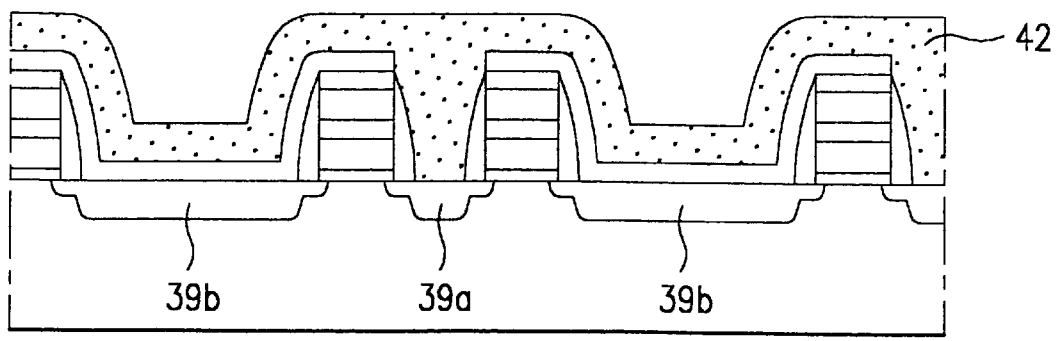
Figure 3D:
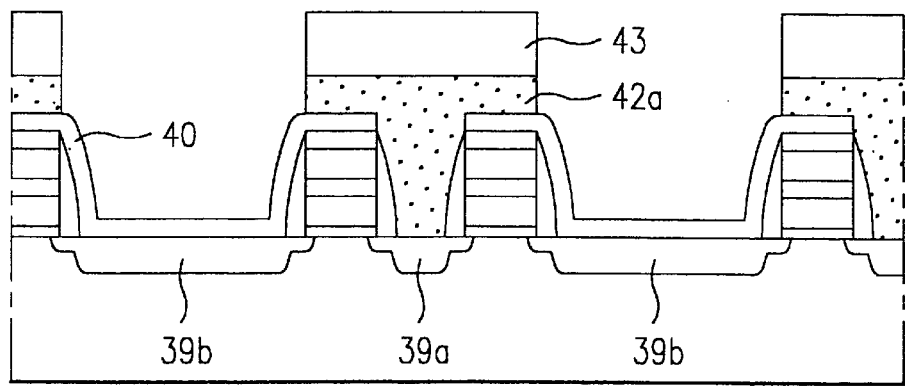

As shown in FIG. 3C, a conductive layer 42 of doped polysilicon, tungsten or the like is deposited on the semiconductor substrate 31 to be in contact with the source regions 39a. As shown in FIG. 3D, a second photoresist film 43 is coated on the semiconductor substrate 31 and subjected to selective patterning by exposure and development to expose the first interlayer insulating film 40 over the drain regions 39b. Then, the conductive layer 42 is subjected to anisotropic etching to expose only portions of the first interlayer insulating film 40 over the drain regions 39b using the patterned second photoresist film 43 to form a flat source line 42a on the semiconductor substrate 31.

Figure 3E:
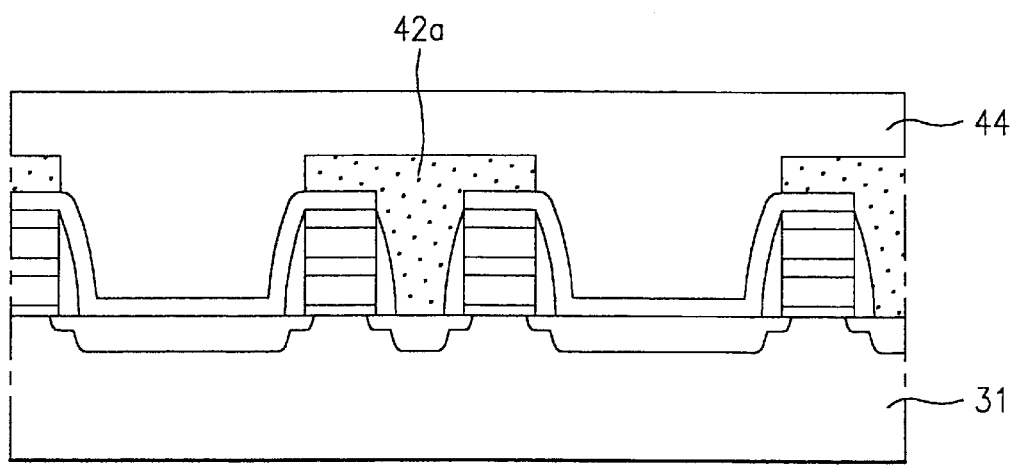
Figure 3F:
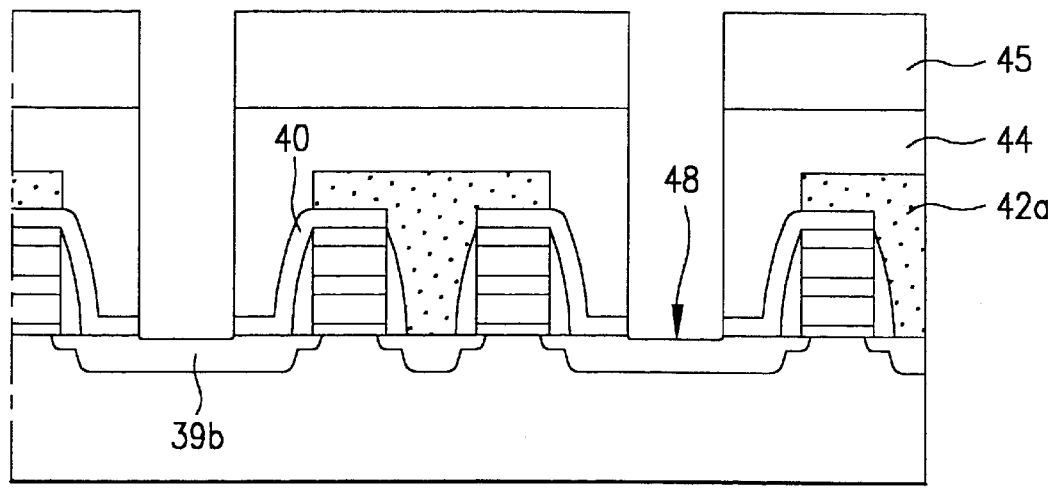
Figure 3G:
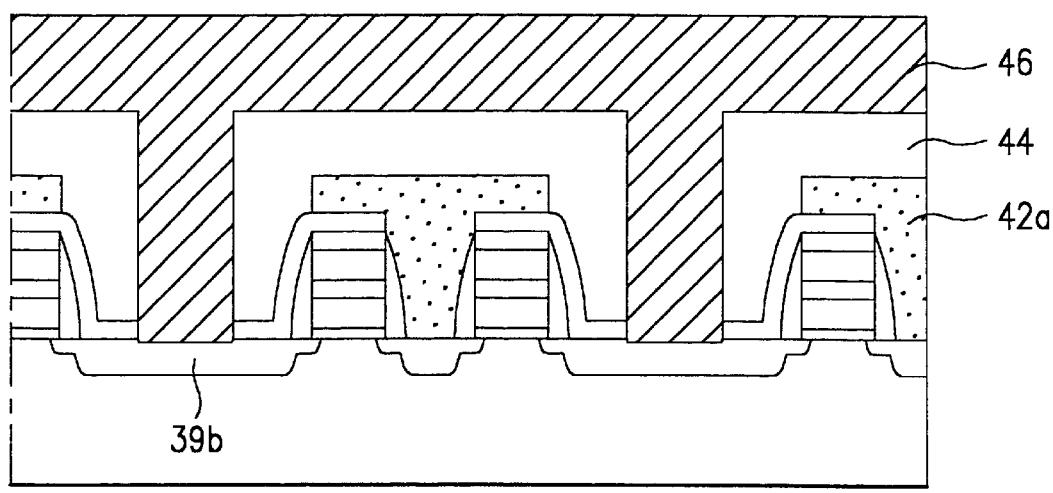

As shown in FIG. 3E, a second interlayer insulating film 44 is formed on an entire surface of the semiconductor substrate 31. As shown in FIG. 3F, a third photoresist film 45 is coated and subjected to selective patterning by exposure and development, which is used as a mask when subjecting the second interlayer insulating film 44 and the first interlayer-insulating film 40 to anisotropic etching to form bit line contact regions 48. As shown in FIG. 3G, a metal layer and a silicon layer are deposited on the second interlayer insulating film 44 to be in contact with the drain regions 39b at the bit line contact regions 48 and form bit lines 46.

As described above, the preferred embodiment of the flash memory device and the method for fabricating the same according to the present invention have various advantages. The form of wiring in source regions (e.g., a plate) of the preferred embodiments allows elimination of the source wiring in the background art. In the background art, each source wiring was provided for every 16–20 bit lines. Thus, the preferred embodiments can reduce an effective cell size by approximately 1/16 when the same design rule is applied. Further, the strict layout tolerances of the active regions and the metal lines can allow overlap tolerances based on the layout resulting from the zigzag disposal of the bit line contacts to facilitate a reduction of LOCOS pitches. Accordingly, a cell size can be reduced relative to the background art when a predetermined design rule is applied. In addition, a matrix of source wiring can use, for example, plates in the memory array. Thus, the source current path is composed of, not active source line and metal lines, but a conductive plate or the like that reduces a source resistance. A preferred source wiring plate formed of polysilicon can reduce each cell resistance in a memory array down to 100 ohms or below and, formed of polycide can reduce the each cell resistance down to 10 ohms or below. The reduced source resistance significantly increases uniformity of cell operations.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A method for fabricating a memory device, comprising the steps of:
    forming floating gates stacked on tunnel insulating films on a plurality of prescribed regions of a semiconductor substrate;
    forming a plurality of control gate lines extending in a first direction to cover the floating gates, wherein a distance between adjacent control gate lines varies between first and second prescribed distances;
    forming sidewall spacers on both sides of the floating gates and the control gate lines;
    respectively forming source regions and drain regions in the semiconductor substrate on opposite sides of the floating gates and the control gate lines between the sidewall spacers;
    depositing a first interlayer insulating film on the semiconductor substrate;
    forming source contact regions that expose the source regions through the first interlayer insulating film;
    depositing a conductive layer on the first interlayer insulating film coupled to the source contact regions;
    removing portions of the conductive layer on the drain regions to form a common source;
    depositing a second interlayer insulating film on the semiconductor substrate;
    forming drain contact regions that expose the drain regions through the second interlayer insulating film; and
    forming bit lines extending in a direction perpendicular to the first direction coupled to the drain contact regions, wherein bit line contact regions in adjacent bit lines are offset in the second direction.

2. The method of claim 1, wherein the common source is a plate, and wherein each cell source resistance in a cell array is less than approximately 100 ohms.

3. The method of claim 1, wherein the first prescribed distance is greater than the second prescribed distance.

4. The method of claim 1, wherein the source regions adjacent a single control gate form a zigzag pattern.

5. A method for forming a common source in a semiconductor flash memory comprising:
    forming floating gates on tunnel insulating films on a plurality of prescribed regions of a semiconductor substrate;
    forming a plurality of control gate lines extending in a first direction with a zigzag pattern to cover the floating gates, wherein the distance between adjacent control gate lines varies between first and second distances;
    forming source regions in the semiconductor substrate between adjacent floating gates that are separated by the second prescribed distance;
    forming drain regions in the semiconductor substrate between adjacent floating gates that are separated by the first prescribed distance;
    depositing a first interlayer insulating film on the semiconductor substrate;
    forming source contact regions that expose the source regions through the first interlayer insulating film;
    depositing a conductive layer on the first interlayer insulating film coupled to the source contact regions; and
    removing portions of the conductive layer on the drain regions to form a common source.

6. The method of claim 5, wherein the common source is a plate.

7. A method for fabricating control gatelines for a semiconductor flash memory comprising:
    forming floating gates stacked on tunnel insulating films on a plurality of regions of a semiconductor substrate;
    forming a plurality of control gate lines extending in a first direction to cover the floating gates, wherein a distance between adjacent control gate lines varies between first and second prescribed distances; and
    forming bit lines extending in a direction perpendicular to the first prescribed direction, wherein bit line contact regions in adjacent bit lines are offset in the second prescribed direction.

8. A method according to claim 7, wherein the first prescribed distance is greater than the second prescribed distance.

9. A method according to claim 7, wherein the control gate lines form rectangular portions where the control gate lines are separated by the first and second prescribed distances.

10. A method according to claim 7, wherein the control gate lines include gate cap insulating films, control gates, and gate insulating films.

11. A method according to claim 7, wherein the floating gates have a matrix form.

12. In a method for forming a flash memory semiconductor device having first and second gates, the improvement comprising:

forming a matrix of first gates on a semiconductor substrate;

forming a plurality of second gates extending along a first direction to cover the first gates, the plurality of second gates having a zigzag form to vary a distance between adjacent second gates;

forming source regions in the semiconductor substrate between adjacent first gates that are separated by a second prescribed distance; and forming drain regions in the semiconductor substrate between adjacent first gates that are separated by a first distance.

13. The method of claim 12, wherein the first gates are floating gates stacked on tunnel insulating films on the semiconductor substrate and wherein the second gates are gate lines including stacked gate insulating films, control gate lines, and gate cap insulating films.

* * * * *